United States Patent
US 6,584,035 B2
Di Iorio et al.
Date of Patent: Jun. 24, 2003

(54) SUPPLY NOISE REDUCTION IN MEMORY DEVICE COLUMN SELECTION

(75) Inventors: Ercole Di Iorio, Scurcola Marsicana (IT); Giulio G. Marotta, Contigliano (IT); Giovanni Santin, Santa Rufina (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/032,375

(22) Filed: Dec. 21, 2001

(65) Prior Publication Data

US 2002/0172088 A1 Nov. 21, 2002

(30) Foreign Application Priority Data

Dec. 28, 2000 (IT) .................................... RM2000A0698

(51) Int. Cl.[7] ................................................ G11C 8/00
(52) U.S. Cl. ............................. 365/230.06; 365/189.08
(58) Field of Search ...................... 365/230.06, 189.08, 365/230.01, 230.08, 194

(56) References Cited

U.S. PATENT DOCUMENTS

| | | | |
|---|---|---|---|
| 4,763,026 A | 8/1988 | Tsen et al. | |
| 4,975,597 A | * 12/1990 | Houston | 326/108 |
| 5,367,493 A | 11/1994 | Yamagata | |
| 5,638,322 A | 6/1997 | Lacey | |
| 5,761,112 A | 6/1998 | Murray et al. | |
| 5,903,033 A | 5/1999 | Suwa | |
| 5,949,728 A | 9/1999 | Liu et al. | |
| 6,151,250 A | 11/2000 | Choi et al. | |
| 6,205,080 B1 | * 3/2001 | Seyyedy et al. | 365/230.06 |
| 6,337,823 B1 | 1/2002 | Seo et al. | |

* cited by examiner

Primary Examiner—Michael S. Lebentritt
Assistant Examiner—Anh Phung
(74) Attorney, Agent, or Firm—Leffert Jay & Polglaze, P.A.

(57) ABSTRACT

Column select circuits having improved immunity to supply potential noise during sensing of the programmed state of a target memory cell are suited for use in low-voltage memory devices. Such column select circuits contain driver circuits having a filtered path and an unfiltered path for applying a supply potential to a gate of a pass transistor. The unfiltered path is utilized during a first sensing phase, such as during decoding or precharging of the bit lines, when transition speed of the pass transistors is desired. The filtered path is utilized at least during a second sensing phase while the sensing device is detecting the programmed state of the target memory cell. By reducing the noise of the supply potential using the filtered path, margins are improved on the sensing device and the sensing device is thus capable of operating at lower supply potentials.

53 Claims, 4 Drawing Sheets

SUPPLY NOISE REDUCTION IN MEMORY DEVICE COLUMN SELECTION

STATEMENT OF RELATED APPLICATIONS

This application claims priority to Italian Patent Application Serial No. RM2000A000698 filed Dec. 28, 2000, which is commonly assigned.

TECHNICAL FIELD OF THE INVENTION

The present invention relates generally to semiconductor memory devices, and in particular, the present invention relates to supply noise reduction for controlling column selection in a semiconductor memory device.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

As operating voltages continue to decrease, operation of the memory device must come under tighter constraints. Lower operating voltages lead to lower operating margins. In turn, lower operating margins increase the demands on sensing circuits and related circuits for accessing a memory cell and sensing the data contained therein. For example, sensing devices often rely on a voltage differential to determine the programmed state of a memory cell, either a voltage differential between a target bit line and a reference voltage or a voltage differential between a target bit line and a threshold voltage. As operating voltages are reduced, such sensing devices often must be capable of distinguishing between smaller differentials.

Semiconductor memory devices generally contain a vast number of memory cells arranged in rows and columns. To access a target memory cell, one or more levels of decoding are used. As an example, a memory device may have millions of memory cells, but may only have 128 sensing devices, i.e., devices capable of detecting a programmed state of the memory cell and thus its data value. A decoding scheme is necessary to couple one of the millions of memory cells, i.e., the target memory cell, to one of the sensing devices as each sensing device may be selectively coupled to hundreds of thousands of individual memory cells.

A common decoding scheme may include a number of memory cells coupled to a local bit line, a number of local bit lines selectively coupled to a global bit line, and a number of global bit lines selectively coupled to a sensing device. A first pass circuit couples one of the local bit lines to its associated global bit line in response to a first control signal. A second pass circuit couples one of the global bit lines to its associated sensing device in response to a second control signal. A control signal to the target memory cell's word line actively couples that memory cell to its associated local bit line, thus allowing the sensing device to detect its programmed state. The pass circuits risk the introduction of undesirable signal noise in the sensing operation. Reduced sensing margins lead to reduced tolerance of signal noise, i.e., signal noise is more likely to lead to an erroneous data value indication.

For the reasons stated above, and for other reasons stated below which will become apparent to those skilled in the art upon reading and understanding the present specification, there is a need in the art for alternate circuits and methods for accessing a memory cell for sensing in a memory device adapted for low-voltage operation.

SUMMARY OF THE INVENTION

The above-mentioned problems with memory devices and other problems are addressed by the present invention and will be understood by reading and studying the following specification.

Column select circuits are described for improved immunity to supply potential noise during sensing of the programmed state of a target memory cell. Such column select circuits are especially beneficial to low-voltage memory devices, such as those operating at supply potentials of 1.6–2.2V or below. Such column select circuits contain driver circuits having a filtered path and an unfiltered path for applying a supply potential to a gate of a pass transistor. The unfiltered path is utilized during a first sensing phase, such as during decoding or precharging of the bit lines, when transition speed of the pass transistors is desired. The filtered path is utilized at least during a second sensing phase while the sensing device is detecting the programmed state of the target memory cell. By reducing the noise of the supply potential using the filtered path, margins are improved on the sensing device and the sensing device is thus capable of operating at lower supply potentials with increase reliability.

For one embodiment, the invention provides a column select circuit having a pass transistor and further having a driver circuit coupled to supply a gate bias to a gate of the pass transistor. The driver circuit includes an output coupled to the gate of the pass transistor, a filtered path and an unfiltered path. The unfiltered path has a first potential node coupled to receive a first supply potential, and a first field-effect transistor interposed between the first potential node and the output. The filtered path has a second potential node coupled to receive a second supply potential, and a second field-effect transistor interposed between the second potential node and the output. The driver circuit has a first state to couple the gate of the pass transistor to the second potential node through the filtered path and to isolate the gate of the pass transistor from the first potential node. The driver has a second state to couple the gate of the pass transistor to at least the first potential node through the unfiltered path. The driver has a third state to isolate the gate of the pass transistor from both the first potential node and the second potential node.

The filtered path may include an RC filter interposed between the second potential node and the second field-effect transistor to reduce noise from the supply potential received at the second potential node. The driver circuit may further include a third field-effect transistor interposed between the gate of the pass transistor and a third potential node, wherein the third potential node is coupled to receive a third potential such as a ground potential. The gate of the pass transistor may be coupled to the third potential node when the column select circuit is in the third state.

For a further embodiment, the driver circuit is responsive to a first control signal and a second control signal such that the first field-effect transistor is activated when the first control signal has a first logic level and the second control signal has a first logic level, the first field-effect transistor is deactivated and the second field-effect transistor is activated when the first control signal has a second logic level and the second control signal has its first logic level, and the first field-effect transistor and the second field-effect transistor are deactivated when the second control signal has a second logic level regardless of a logic level of the first control signal. For a still further embodiment, the second field-effect transistor is also activated when the first control signal has its first logic level and the second control signal has its first logic level. The first logic level of the first control signal and the first logic level of the second control signal may be the same logic level. Similarly, the second logic level of the first control signal and the second logic level of the second control signal may be the same logic level.

For another embodiment, the invention provides a method of operating a memory device. The method includes deactivating a pass transistor during a non-sensing phase to isolate a target memory cell from a sensing device, and activating the pass transistor during first and second sensing phases to permit coupling of the target memory cell to the sensing device. Activating the pass transistor during the first sensing phase includes coupling a gate of the pass transistor to a first potential node while activating the pass transistor during the second sensing phase includes coupling the gate of the pass transistor to a second potential node through a filtered path and isolating the gate of the pass transistor from the first potential node. The method further includes sensing a programmed state of the target memory cell during the second sensing phase, while the gate of the pass transistor is coupled to the second potential node through the filtered path and while the gate of the pass transistor is isolated from the first potential node. For a further embodiment, activating the pass transistor during the first sensing phase further includes coupling the gate of the pass transistor to the second potential node through the filtered path.

For yet another embodiment, the method of operating a memory device further includes applying a first control signal to a first input of a NAND gate, applying a second control signal to a second input of the NAND gate, and applying the second control signal to an input of an inverter. The output of the NAND gate is applied to a gate of a first p-channel field-effect transistor coupled between the first potential node and the gate of the pass transistor while the output of the inverter is applied to a gate of a second p-channel field-effect transistor coupled between the second potential node and the gate of the pass transistor. The second control signal has a logic high level during the first and second sensing phases, such that the output of the inverter activates the second p-channel field-effect transistor during the first and second sensing phases. The first control signal has a logic high level during the first sensing phase, such that the output of the NAND gate activates the first p-channel field-effect transistor during the first sensing phase. The first control signal has logic low level during the second sensing phase, such that the output of the NAND gate deactivates the first p-channel field-effect transistor during the second sensing phase.

For further embodiments, the invention provides memory devices and electronic systems containing column select circuits of the type described herein. The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1A:
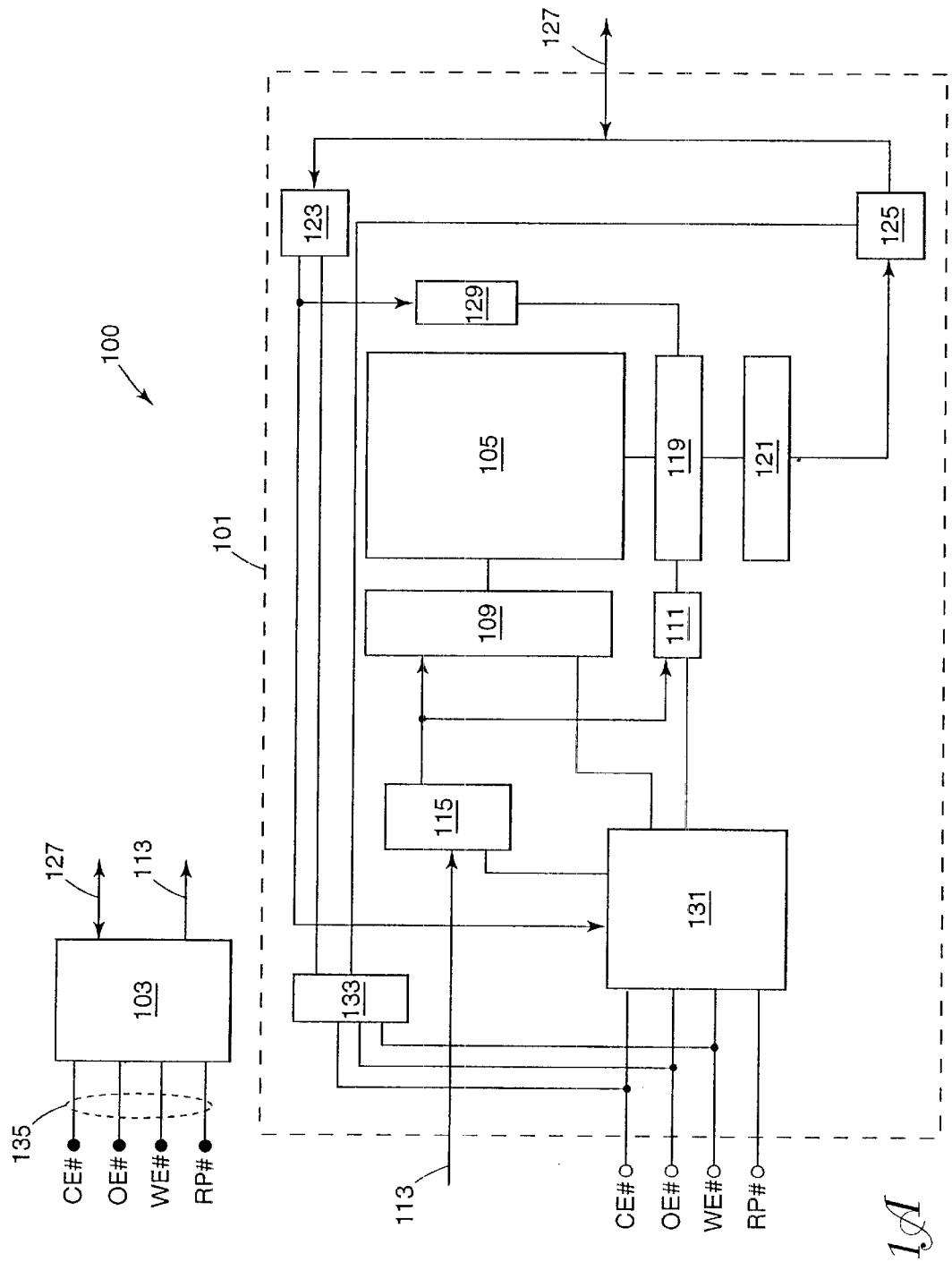
FIG. 1A is a block diagram of a basic flash memory device coupled to a processor as part of an electronic system.

The various embodiments of the invention include column select circuitry for a memory device, such as a flash memory device. FIG. 1A is a functional block diagram of a basic flash memory device 101 that is coupled to a processor 103. The memory device 101 and the processor 103 may form part of a larger electronic system 100. The memory device 101 has been simplified to focus on features of the memory that are helpful in understanding the present invention. The memory device 101 includes an array of memory cells 105. The memory cells are preferably non-volatile floating-gate memory cells and generally have their gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. The column select circuit 119 includes driver circuits in accordance with the embodiments of the invention. Sensing circuitry 121 is used to sense and amplify data stored in the memory cells. Data input 123 and output 125 buffer circuits are included for bi-directional data communication over a plurality of data (DQ) lines 127 with the processor 103. A data latch 129 is typically provided between data input buffer circuit 123 and the DQ lines 127 for storing data values (to be written to a memory cell) received from the DQ lines 127. Data amplified by the sensing circuitry 121 is provided to the data output buffer circuit 125 for output on the DQ lines 127.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals. As stated above, the flash memory device 101 has been simplified to facilitate a basic understanding of the features of the memory. A more detailed understanding of flash memories is known to those skilled in the art.

Figure 1B:
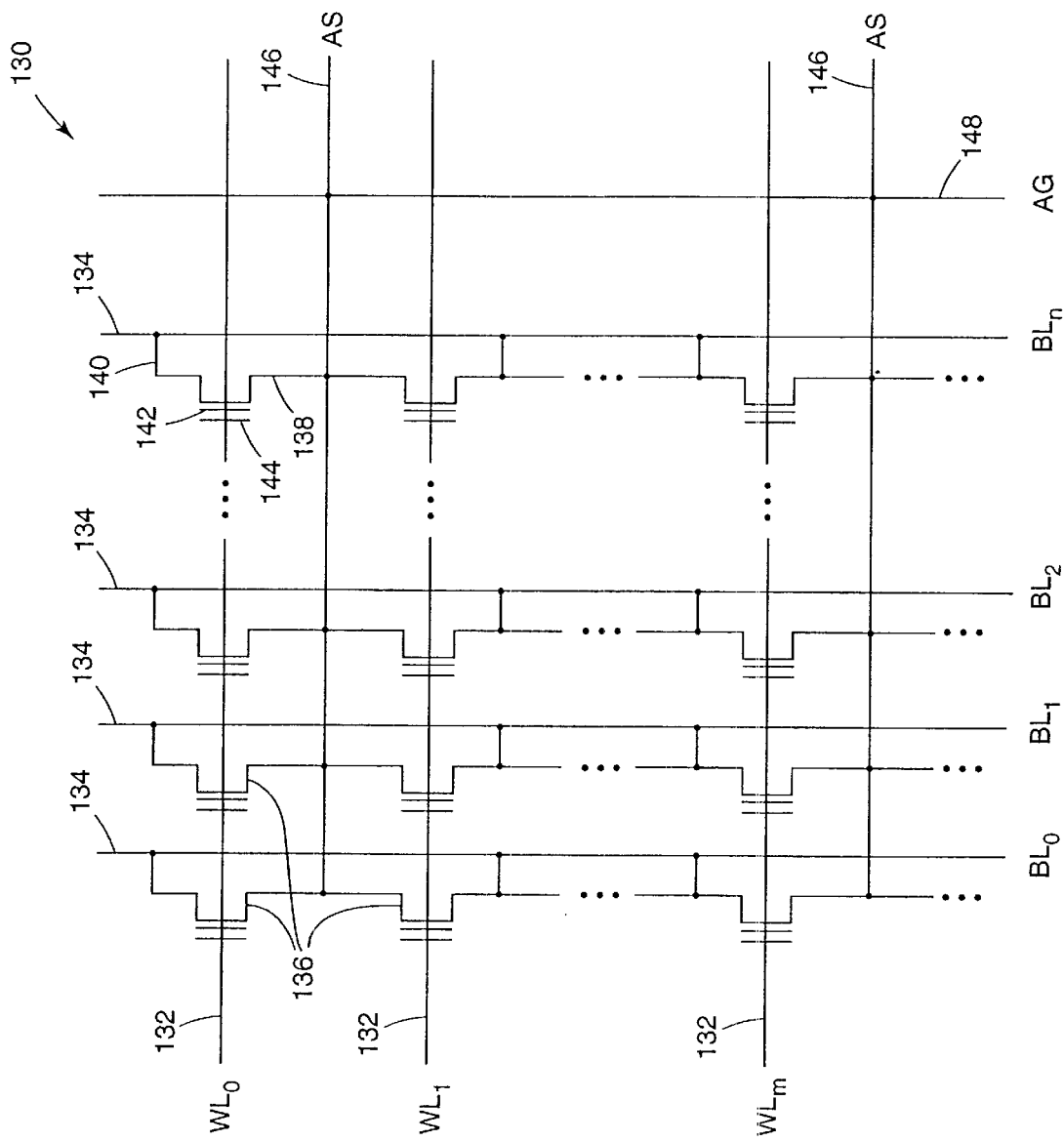
FIG. 1B is a schematic of a portion of a typical non-volatile memory main block as a portion of a memory array.

Arrays of flash memory cells are often configured as floating gate transistors placed at the intersection of word lines and local bit lines. The word lines are coupled to the control gates of the floating gate transistors. FIG. 1B is a schematic of a portion of a typical non-volatile memory main block 130 as a portion of the memory array 105.

The detail of main block 130 is provided to better understand the various embodiments of the invention. However, the invention is not limited to the specific floating-gate memory cell and layout described with reference to FIG. 1B.

As shown in FIG. 1B, the main block 130 includes word lines 132 and intersecting local bit lines 134. For ease of addressing in the digital environment, the number of word lines 132 and the number of local bit lines 134 are each some power of two, e.g., 256 word lines 132 by 4,096 local bit lines 134.

Floating gate transistors 136 are located at each intersection of a word line 132 and a local bit line 134. The floating gate transistors 136 represent the non-volatile memory cells for storage of data. Typical construction of such floating gate transistors 136 include a source 138 and a drain 140 constructed from an $N^+$-type material of high impurity concentration formed in a P-type semiconductor substrate of low impurity concentration, a channel region formed between the source and drain, a floating gate 142, and a control gate 144. Floating gate 142 is isolated from the channel region by a tunneling dielectric and from the control gate 144 by an intergate dielectric. The materials of construction are not critical to the invention, but commonly include doped polysilicon for the gate materials, and silicon oxides, nitrides or oxynitrides for the dielectric materials.

Floating gate transistors 136 having their control gates 144 coupled to a word line 132 typically share a common source 138 depicted as array source 146. To reduce resistance to each source 138, each array source 146 is often coupled to a metal line to ground, such as array ground 148. As shown in FIG. 1B, floating gate transistors 136 coupled to adjacent word lines 132 may share the same array source 146. Floating gate transistors 136 have their drains 140 coupled to a local bit line 134. A column of the floating gate transistors 136 are those transistors having their drains 140 commonly coupled to a given local bit line 134. A row of the floating gate transistors 136 are those transistors having their control gates 144 commonly coupled to a given word line 132.

Target memory cells, i.e., those memory cells whose data is to be sensed, are coupled to sensing circuitry through pass circuits in response to control signals from the column decoder and activated in response to control signals from the row decoder. The control signals from the row decoder are provided to word line drivers to apply a gate bias to the target memory cells. The control signals from the column decoder are provided to drivers to activate one or more pass transistors. In a typical decoding scheme, a first pass transistor of a first pass circuit is activated to couple a sensing device, such as a sense amplifier, to one of a number of global bit lines. The sensing circuitry will normally contain a number of sensing devices. For one embodiment, the sensing circuitry contains 128 sense amplifiers. A second pass transistor of a second pass circuit is activated to couple a global bit line to one of a number of local bit lines. The first pass circuit thus multiplexes the global bit lines to a reduced number of sensing devices while the second pass circuit multiplexes the local bit lines to a reduced number of global bit lines.

Figure 2:
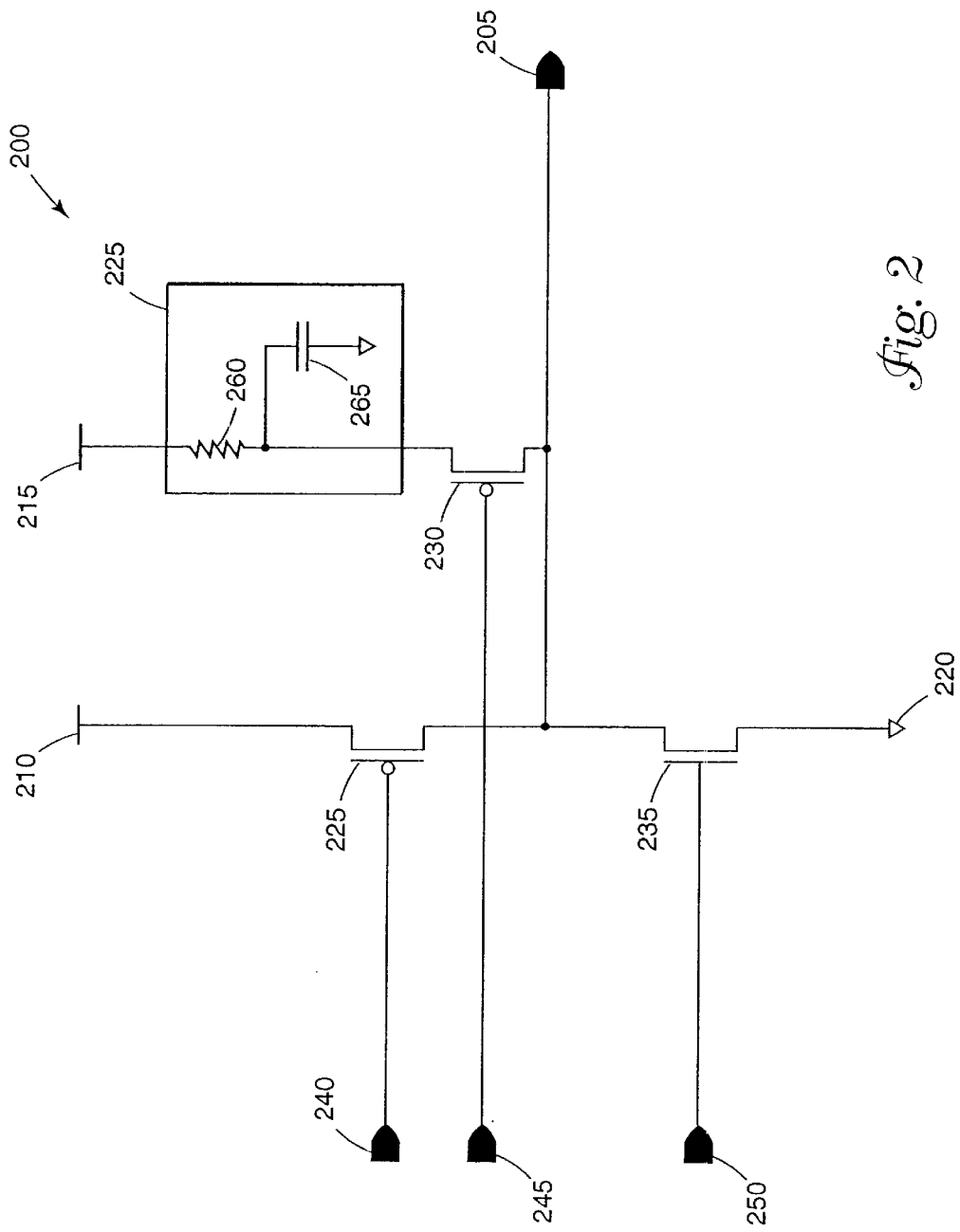
FIG. 2 is a schematic of a column select driver circuit having a filtered and unfiltered path to a supply potential.

FIG. 2 is a schematic of a column select driver circuit 200 having a filtered and unfiltered path to a supply potential in accordance with the invention. The driver circuit 200 generates an output signal on its output 205 having one of two logic levels. A first logic level is generated by coupling the output 205 to one or both of the potential nodes 210 and 215. For one embodiment, the potential nodes 210 and 215 are coupled to receive a supply potential, such as Vcc, and may represent a logic high or logic 1 level. A second logic level is generated by coupling the output 205 to potential node 220. For one embodiment, the potential node 220 is coupled to receive a ground potential and may represent a logic low or logic 0 level.

Each potential node 210, 215 and 220 is selectively coupled to the output 205 through a selective coupling device. Selective coupling devices selectively provide electrical communication or electrical isolation in response to a control signal. For the embodiment depicted in FIG. 2, the selective coupling devices are field-effect transistors (FET), such as p-channel FET (pFET) 225, pFET 230 and n-channel FET (nFET) 235. An FET provides electrical communication when it is activated and electrical isolation when it is deactivated. The pFETs 225 and 230 are activated in response to a control signal having a logic low level provided on their gates and deactivated in response to a control signal having a logic high level provided on their gates. The pFETs 225 and 230 receive their control signals from nodes 240 and 245, respectively. The nFET 235 is activated in response to a control signal having a logic high level provided on its gate and deactivated in response to a control signal having a logic low level provided on its gate. The nFET 235 receives its control signal from node 250.

The path between the potential node 210 and the output 205 through pFET 225 as a selective coupling device is substantially unfiltered, i.e., a waveform presented on potential node 210 could be substantially reproduced on the output 205. The path between the potential node 220 and the output 205 through nFET 235 as a selective coupling device may also be substantially unfiltered. Conversely, the path between the potential node 215 and the output 205 through pFET 230 as a selective coupling device is filtered, such as by filter 255. Filter 255 serves to reduce noise, or undesirable fluctuations, in the supply potential received at potential node 215. Filter 255 may be a lowpass RC filter, having a resistive component 260 and a capacitive component 265, to reduce high-frequency noise. The filtered path of the driver circuit 200 includes the path from the potential node 215 to the output 205 through the filter 255 and the selective coupling device pFET 230.

Figure 3:
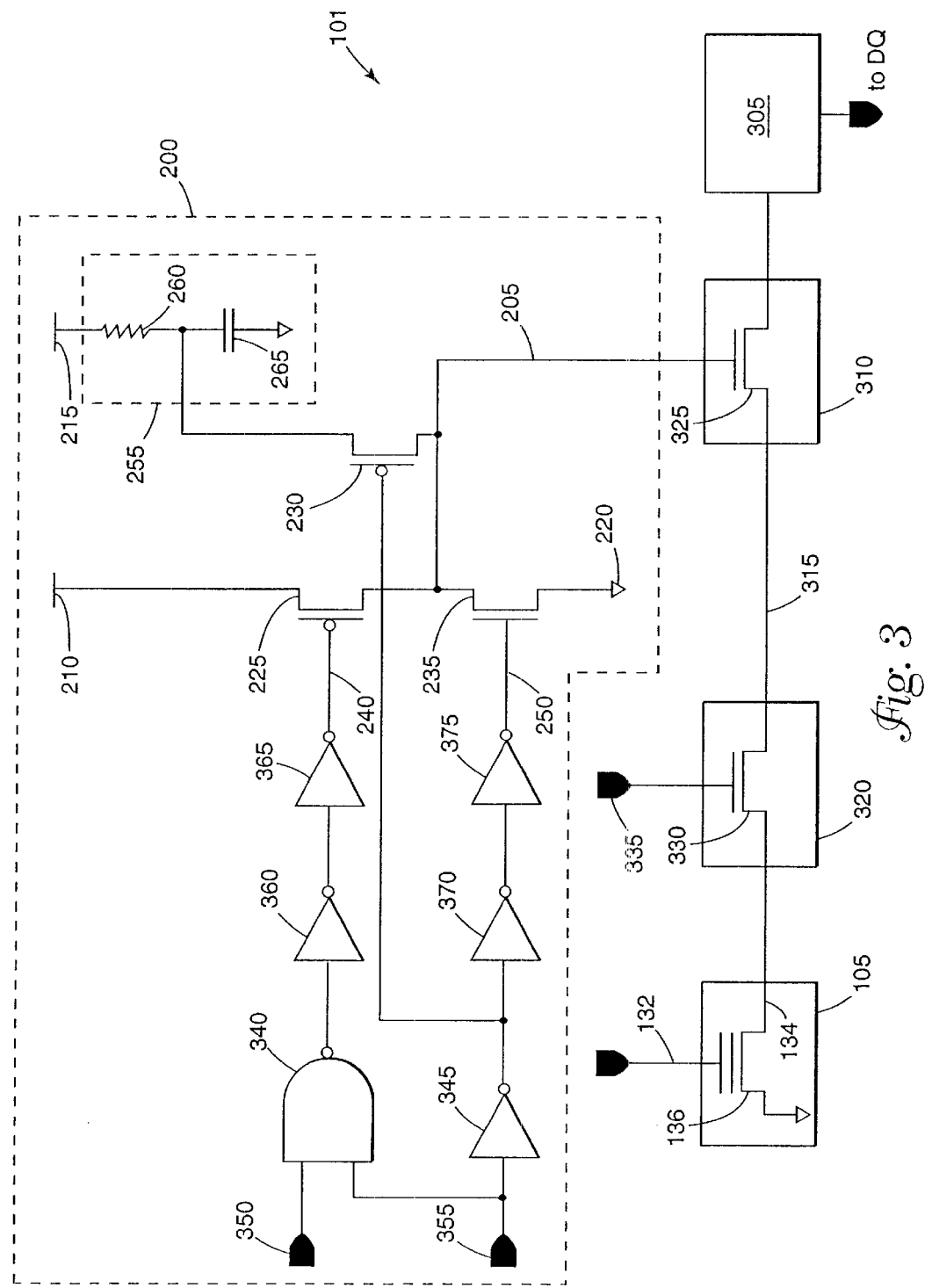
FIG. 3 is a schematic of a portion of a memory device having at least one column select driver circuit having a filtered and unfiltered path to a supply potential.

FIG. 3 is a schematic of a portion of a memory device 101 having at least one column select driver circuit 200 having a filtered and unfiltered path to a supply potential in accordance with the invention. As shown in FIG. 3, a target memory cell 136 is selectively coupled to a sensing device 305 through its associated local bit line 134 and global bit line 315. As noted previously, there are generally many local bit lines 134 associated with a single global bit line 315 and many global bit lines 315 associated with a single sensing device 305 in typical high-density memory devices. The sensing device 305 is also generally one of many sensing devices 305 as may be contained in the sensing circuitry 121 as depicted in FIG. 1A.

The global bit line 315 associated with the target memory cell 136 is coupled to its associated sensing device 305 using pass circuit 310. Pass circuit 310 is depicted as containing a single selective coupling device or pass transistor 325 providing the selective coupling between the global bit line 315 and the sensing device 305. Those skilled in the art of memory devices will recognize that pass circuit 310 would contain additional pass transistors associated with other global bit lines. Furthermore, additional pass transistors may be interposed between the global bit line 315 and the sensing device 305. However, at least one such pass transistor will have its gate coupled to selectively receive its control signal through both a filtered and an unfiltered path.

The local bit line 134 associated with the target memory cell 136 is coupled to its associated global bit line 315 using pass circuit 320. Pass circuit 320 is depicted as containing a single selective coupling device or pass transistor 330 providing the selective coupling between the local bit line 134 and the global bit line 315. Those skilled in the art of memory devices will recognize that pass circuit 320 would contain additional pass transistors associated with other local bit lines. Furthermore, additional pass transistors may be interposed between the local bit line 134 and the global bit line 315. However, at least one such pass transistor will have its gate coupled to receive a control signal from node 335. Note that node 335 alternatively or additionally could be coupled to a driver circuit 200 as described herein. At least one pass circuit of the memory device 101 includes a driver circuit of the type described herein. However, other driver circuits may be utilized on remaining pass circuits. The pass circuits and drivers may form a portion of the column select circuit 119 as depicted in FIG. 1A.

For one embodiment, a driver circuit 200 is provided only to those pass transistors 325 of the pass circuit 310 closest to the sensing device 305. Pass circuit 310 is generally located physically proximate the sensing device 305 such that the downstream line capacitance is relatively low in comparison to the upstream line capacitance of the global bit line 315 or even the local bit line 134. Because the pass transistors function essentially as cascode amplifiers, the output of each pass transistor is susceptible to supply potential noise. Noise in the supply potential, and thus the gate bias of each pass transistor, will detrimentally affect the margin of the sensing device 305 and its ability to differentiate between programmed states of the target memory cell 136. Due to the relatively low line capacitance downstream of the pass transistor 325, this pass transistor will affect the margin of the sensing device more dramatically than upstream pass transistors. It is thus desirable to reduce supply potential noise in the control signals provided to at least those pass transistors 325 of the pass circuit closest to the sensing device 305, i.e., pass circuit 310.

The driver circuit 200 of FIG. 3 contains additional logic circuitry demonstrating how two control signals, in conjunction with appropriate logic, can be used to cycle the driver circuit 200 through three phases of operation, i.e., a first sensing phase, a second sensing phase and a non-sensing phase. The driver circuit 200 has three states corresponding to the phases of operation. In the first and second sensing phases, the pass transistor 325 is activated to permit coupling of the target memory cell 136 to its associated sensing device 305. During the first sensing phase, the pass transistor 325 receives its activating control signal using an unfiltered path. During the second sensing phase, the pass transistor 325 receives its activating control signal through a filtered path and is isolated from the unfiltered path. In the non-sensing phase, the pass transistor 325 is deactivated to isolate the target memory cell 136 from its associated sensing device 305.

As shown in FIG. 3, a first control signal is applied to a first input of NAND gate 340 from node 350. The first control signal, herein referred to as FILTER_ON, is indicative of whether the pass transistor 325 should be isolated from the unfiltered supply potential. Using the logic circuits as shown in FIG. 3, a logic low level of FILTER_ON indicates that the pass transistor 325 is to be isolated from the potential node 210 while a logic high level indicates that the pass transistor 325 may be coupled to the potential node 210. A second control signal is applied to a second input of NAND gate 340 and to an inverter 345 from node 355. The second control signal, herein referred to as YPASS, is indicative of whether the pass transistor 325 should be activated or deactivated. Using the logic circuits as shown in FIG. 3, a logic low level of YPASS indicates that the pass transistor 325 is to be coupled to potential node 220 for deactivation while a logic high level indicates that the pass transistor 325 is to be coupled to at least one of potential nodes 210 and 215 for activation.

In operation, the memory device 101 initially may be in the non-sensing phase of operation, at least as it relates to the target memory cell 136. The YPASS control signal, for the logic circuits as depicted in FIG. 3, has a logic low level during the non-sensing phase. The output of the inverter 345 applied to the gate of pFET 230, now a logic high level, will deactivate pFET 230 and isolate the gate of the pass transistor 325 from potential node 215. Because the nFET 235 is of a type opposite the pFET 230, its response to the same control signal will be opposite. As such, the output of the inverter 345 applied to the gate of the nFET 235 will activate nFET 235, thus coupling the gate of the pass transistor 325 to potential node 220. Isolating the gate of the pass transistor 325 from the supply potentials and coupling it to the ground potential will thus provide a control signal having a logic low level, resulting in deactivation of the n-channel pass transistor 325 and isolation of the target memory cell 136 from the sensing device 305.

During the first sensing phase, the memory device 101 prepares for sensing the programmed state of a target memory cell 136, but does not perform the actual sensing. As such, the memory device 101 initially decodes a location address identifying the appropriate target memory cell 136 for activation of the appropriate pass transistors 325 and 330. The memory device 101 may also precharge the global bit line 315 and local bit line 134 to some reference potential. During these types of operations, typical supply potential noise has minimal detrimental impact on the performance and reliability of the sensing device 305 and thus the memory device 101. Transition time of the pass transistors is more critical during these preparatory operations. To maintain fast transition times, the gate bias applied to the pass transistors should be capable of exhibiting a step response. The pass transistor should thus be permitted to receive a gate bias using an unfiltered path during this phase.

Using the logic circuits as depicted in FIG. 3, the YPASS control signal and the FILTER_ON control signal each have a logic high level during the first sensing phase. In this manner, the gate of the pass transistor 325 is coupled to the potential node 210 to receive an unfiltered supply potential. The gate of the pass transistor 325 is concurrently isolated from the potential node 220. In this configuration, the gate of the pass transistor 325 is also coupled to the potential node 215 through a filtered path. While it is not necessary to concurrently couple the gate of the pass transistor 325 to both potential nodes 210 and 215 during the first sensing phase, there are advantages to doing so. By concurrently coupling the gate of the pass transistor 325 to both potential nodes 210 and 215 during the first sensing phase, the capacitive component 265 in the filtered path is quickly charged. Subsequent transition to the second sensing phase, as described below, will not risk loss of the activating gate bias on pass transistor 325 due to the RC time constant of an uncharged filter.

During the second sensing phase, the memory device 101 senses the programmed state of the target memory cell 136 and thus its data value. To improve operating margins of the sensing device 305, especially in low-voltage applications, it is desirable to reduce noise in the supply potential provided to the gate of the pass transistor 325. Accordingly, the gate of the pass transistor 325 should be coupled to the potential node 215 through the filtered path and isolated from the potential node 210.

Using the logic circuits as depicted in FIG. 3, the YPASS control signal remains at the logic high level and the FILTER_ON control signal transitions to a logic low level during the second sensing phase. In this manner, the gate of the pass transistor 325 is isolated from the potential nodes 210 and 220, but is coupled to the potential node 215 through the filtered path. The gate of the pass transistor 325 thus receives a filtered supply potential as its control signal, resulting in improved noise immunity of the sensing operation.

During the second sensing phase, a gate bias is applied to the target memory cell 136 across its word line 132. If the target memory cell 136 is programmed, i.e., a first programmed state, the gate bias applied across the word line 132 will be insufficient to overcome the threshold voltage of the target memory cell 136 such that the target memory cell 136 will conduct little or no current. If the target memory cell 136 is erased, i.e., a second programmed state, the gate bias applied across the word line 132 will be higher than the threshold voltage of the target memory cell 136 such that the target memory cell 136 will freely conduct current. The sensing device 305 can detect the programmed state of the target memory cell 136 based on this difference in conductance. For example, where the bit lines have been precharged to some reference potential level, applying the gate bias to a programmed memory cell will have little or no effect on the potential level of the bit lines, while applying the gate bias to an erased memory cell will result in a drop in potential level of the bit lines. Sense amplifiers are well known for detecting and amplifying such minute voltage differentials.

As shown in FIG. 3, the outputs of the NAND gate 340 and the inverter 345 may be buffered, such as by the pairs of inverters 360/365 and 370/375, respectively. In addition, other combinations of logic circuits can be utilized in place of the NAND gate 340 and the inverter 345 to generate appropriate control signals on nodes 240, 245 and 250 in order to couple the gate of the pass transistor 325 to at least the potential node 210 during the first sensing phase, to isolate the gate of the pass transistor 325 from the potential node 210 during the second sensing phase, and to couple the gate of the pass transistor 325 to the potential node 215 through the filtered path during the second sensing phase.

After latching the detected data value, the memory device may return to the non-sensing phase of operation. Timing of the various phases of operation is controlled by the command control circuit of the memory device. The various control signals, such as FILTER_ON and YPASS, are generated by the command control circuit for control of access to the memory array as described herein.

CONCLUSION

Column select circuits have been described for improved immunity to supply potential noise during sensing of the programmed state of a target memory cell. Such column select circuits contain driver circuits having a filtered path and an unfiltered path for applying a supply potential to a gate of a pass transistor. The unfiltered path is utilized during a first sensing phase, such as during decoding or precharging of the bit lines, when transition speed of the pass transistors is desired. The filtered path is utilized at least during a second sensing phase while the sensing device is detecting the programmed state of the target memory cell. By reducing the noise of the supply potential using the filtered path, margins are improved on the sensing device and the sensing device is thus capable of operating at lower supply potentials.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A column select circuit having a pass transistor and further having a driver circuit coupled to supply a gate bias to a gate of the pass transistor, wherein the driver circuit comprises:
   an output coupled to the gate of the pass transistor;
   an unfiltered path having a first potential node coupled to receive a first supply potential, and a first field-effect transistor interposed between the first potential node and the output; and
   a filtered path having a second potential node coupled to receive a second supply potential, and a second field-effect transistor interposed between the second potential node and the output;
   wherein the driver circuit has a first state to couple the gate of the pass transistor to the second potential node through the filtered path and to isolate the gate of the pass transistor from the first potential node;
   wherein the driver has a second state to couple the gate of the pass transistor to at least the first potential node through the unfiltered path; and wherein the driver has a third state to isolate the gate of the pass transistor from both the first potential node and the second potential node.

2. The column select circuit of claim 1, wherein the filtered path includes an RC filter interposed between the second potential node and the second field-effect transistor.

3. The column select circuit of claim 2, wherein the RC filter includes a resistive component interposed between the second potential node and an intermediate node and a capacitive component interposed between the intermediate node and a ground potential node, and wherein the intermediate node is coupled to a source/drain region of the second field-effect transistor.

4. The column select circuit of claim 1, wherein the driver circuit further comprises a third field-effect transistor interposed between the gate of the pass transistor and a third potential node, wherein the third potential node is coupled to receive a third potential.

5. The column select circuit of claim 4, wherein the gate of the pass transistor is coupled to the third potential node when the column select circuit is in the third state.

6. The column select circuit of claim 4, wherein the third potential is a ground potential.

7. The column select circuit of claim 1, wherein the driver circuit is responsive to a first control signal and a second control signal such that the first field-effect transistor is activated when the first control signal has a first logic level and the second control signal has a first logic level, the first field-effect transistor is deactivated when the first control signal has a second logic level and the second control signal has its first logic level, and the first field-effect transistor and the second field-effect transistor are deactivated when the second control signal has a second logic level regardless of a logic level of the first control signal.

8. The column select circuit of claim 7, wherein the second field-effect transistor is also activated when the first control signal has its first logic level and the second control signal has its first logic level.

9. The column select circuit of claim 7, wherein the first logic level of the first control signal and the first logic level of the second control signal are the same logic level, and wherein the second logic level of the first control signal and the second logic level of the second control signal are the same logic level.

10. The column select circuit of claim 9, wherein the first logic level of the first control signal and the first logic level of the second control signal are a logic high, and wherein the second logic level of the first control signal and the second logic level of the second control signal are a logic low.

11. The column select circuit of claim 1, wherein the driver circuit is responsive to a first control signal and a second control signal, wherein the first control signal and the second control signal are combined in a NAND gate and supplied to a gate of the first field-effect transistor, and wherein the second control signal is inverted and applied to a gate of the second field-effect transistor.

12. The column select circuit of claim 11, wherein an output of the NAND gate is buffered prior to being supplied to the gate of the first field-effect transistor.

13. The column select circuit of claim 11, wherein the driver circuit further comprises a third field-effect transistor interposed between the gate of the pass transistor and a third potential node, wherein the third potential node is coupled to receive a third potential, and wherein a gate of the third field-effect transistor is coupled to receive the inverted first control signal.

14. The column select circuit of claim 13, wherein the second field-effect transistor is of a first type and the third field-effect transistor is of a second, opposite, type such that the third field-effect transistor is deactivated when the second field-effect transistor is activated.

15. The column select circuit of claim 1, wherein the driver circuit further comprises:
    a third field-effect transistor interposed between the gate of the pass transistor and a third potential node, wherein the third potential node is coupled to receive a third potential;
    a NAND gate having a first input coupled to receive a first control signal, a second input coupled to receive a second control signal, and an output for supplying an output signal to a gate of the first field-effect transistor; and
    an inverter having an input coupled to receive the second control signal and an output for supplying an output signal to a gate of the second field-effect transistor and to a gate of the third field-effect transistor;
    wherein the second field-effect transistor and the first field-effect transistor are each p-channel field-effect transistors and the third field-effect transistor is an n-channel field-effect transistor.

16. The column select circuit of claim 15, wherein the output signal of the NAND gate is buffered prior to being supplied to the gate of the first field-effect transistor and the output signal of the inverter is buffered prior to being supplied to the gate of the third field-effect transistor.

17. A column select circuit having a pass transistor and further having a driver circuit coupled to supply a gate bias to a gate of the pass transistor, wherein the driver circuit comprises:
    an output coupled to the gate of the pass transistor;
    an unfiltered path having a first potential node coupled to receive a first supply potential, and a first field-effect transistor interposed between the first potential node and the output; and
    a filtered path having a second potential node coupled to receive a second supply potential, a second field-effect transistor interposed between the second potential node and the output, and an RC filter interposed between the second potential node and the second field-effect transistor;
    wherein the driver circuit is responsive to a first control signal and a second control signal such that the first field-effect transistor is activated when the first control signal has a first logic level and the second control signal has a first logic level, the first field-effect transistor is deactivated when the first control signal has a second logic level and the second control signal has its first logic level, and the first field-effect transistor and the second field-effect transistor are deactivated when the second control signal has a second logic level regardless of a logic level of the first control signal.

18. The column select circuit of claim 17, wherein the RC filter includes a resistive component interposed between the second potential node and an intermediate node and a capacitive component interposed between the intermediate node and a ground potential node, and wherein the intermediate node is coupled to a source/drain region of the second field-effect transistor.

19. The column select circuit of claim 17, wherein the driver circuit further comprises a third field-effect transistor interposed between the gate of the pass transistor and a third potential node, wherein the third potential node is coupled to receive a third potential.

20. The column select circuit of claim 19, wherein the third field-effect transistor is activated when the second control signal has its second logic level regardless of a logic level of the first control signal.

21. The column select circuit of claim 19, wherein the third potential is a ground potential.

22. The column select circuit of claim 17, wherein the second field-effect transistor is also activated when the first control signal has its first logic level and the second control signal has its first logic level.

23. The column select circuit of claim 17, wherein the first logic level of the first control signal and the first logic level of the second control signal are the same logic level, and wherein the second logic level of the first control signal and the second logic level of the second control signal are the same logic level.

24. The column select circuit of claim 23, wherein the first logic level of the first control signal and the first logic level of the second control signal are a logic high, and wherein the second logic level of the first control signal and the second logic level of the second control signal are a logic low.

25. A column select circuit having a pass transistor and further having a driver circuit coupled to supply a gate bias to a gate of the pass transistor, wherein the driver circuit comprises:
   an output coupled to the gate of the pass transistor;
   a first supply potential node;
   a second supply potential node;
   a first ground potential node;
   a second ground potential node;
   a first field-effect transistor having a first source/drain region coupled to the first supply potential node and a second source/drain region coupled to the output;
   a second field-effect transistor having a first source/drain region and having a second source/drain region coupled to the output;
   a third field-effect transistor having a first source/drain region coupled to the output and a second source/drain region coupled to the first ground potential node;
   a resistive component interposed between the first source/drain region of the second field-effect transistor and the second supply potential node; and
   a capacitive component interposed between the first source/drain region of the second field-effect transistor and the second ground potential node;
   wherein the driver circuit is responsive to a first control signal having a first or second logic level and a second control signal having a first or second logic level such that the first field-effect transistor is activated only when the first control signal has its first logic level and the second control signal has its first logic level, the second field-effect transistor is activated only when the second control signal has its first logic level regardless of a logic level of the first control signal, and the third field-effect transistor is activated only when the second control signal has its second logic level regardless of a logic level of the first control signal.

26. The column select circuit of claim 25, wherein the first supply potential node and the second supply potential node are coupled to receive the same supply potential.

27. The column select circuit of claim 25, wherein the first ground potential node and the second ground potential node are coupled to receive the same ground potential.

28. The column select circuit of claim 25, wherein the first logic level of the first control signal and the first logic level of the second control signal are the same logic level, and wherein the second logic level of the first control signal and the second logic level of the second control signal are the same logic level.

29. A method of operating a memory device, comprising:
   deactivating a pass transistor during a non-sensing phase to isolate a target memory cell from a sensing device;
   activating the pass transistor during a first sensing phase to permit coupling of the target memory cell to the sensing device, wherein activating the pass transistor during the first sensing phase comprises coupling a gate of the pass transistor to a first potential node;
   activating the pass transistor during a second sensing phase to permit coupling of the target memory cell to the sensing device, wherein activating the pass transistor during the second sensing phase comprises coupling the gate of the pass transistor to a second potential node through a filtered path and isolating the gate of the pass transistor from the first potential node; and
   sensing a programmed state of the target memory cell during the second sensing phase, while the gate of the pass transistor is coupled to the second potential node through the filtered path and while the gate of the pass transistor is isolated from the first potential node.

30. The method of claim 29, wherein the method is performed in the order presented.

31. The method of claim 29, wherein coupling the gate of the pass transistor to the first potential node comprises activating a first field-effect transistor coupled between the first potential node and the gate of the pass transistor.

32. The method of claim 31, wherein isolating the gate of the pass transistor from the first potential node comprises deactivating the first field-effect transistor.

33. The method of claim 29, wherein activating the pass transistor during the first sensing phase further comprises coupling the gate of the pass transistor to the second potential node through the filtered path.

34. The method of claim 29, wherein coupling the gate of the pass transistor to the second potential node through the filtered path comprises activating a second field-effect transistor coupled between the second potential node and the gate of the pass transistor.

35. The method of claim 29, wherein the filtered path includes an RC filter.

36. The method of claim 29, further comprising:
   applying at least one of a first control signal and a second control signal to a first logic circuit, thereby producing a third control signal at an output of the first logic circuit;
   applying at least one of the first control signal and the second control signal to a second logic circuit, thereby producing a fourth control signal at an output of the second logic circuit;
   applying the third control signal to a gate of a first field-effect transistor coupled between the first potential node and the gate of the pass transistor; and
   applying the fourth control signal to a gate of a second field-effect transistor coupled between the second potential node and the gate of the pass transistor;
   wherein the first control signal has a first logic level during the first sensing phase and a second logic level during the second sensing phase;
   wherein the second control signal has a first logic level during the first and second sensing phases;
   wherein the first field-effect transistor is activated in response to the third control signal during the first sensing phase;

wherein the first field-effect transistor is deactivated in response to the third control signal during the second sensing phase; and wherein the second field-effect transistor is activated in response to the fourth control signal at least during the second sensing phase.

37. The method of claim 36, wherein the second field-effect transistor is also activated in response to the fourth control signal during the first sensing phase.

38. The method of claim 36, wherein the first control signal has a logic high level during the first sensing phase, the first control signal has a logic low level during the second sensing phase, and the second control signal has the logic high level during the first and second sensing phases.

39. The method of claim 36, wherein the first logic circuit is a NAND gate and the second logic circuit is an inverter, and wherein the first and second control signals are applied to the NAND gate and only the second control signal is applied to the inverter.

40. The method of claim 36, further comprising:
buffering the third control signal prior to applying the third control signal to the gate of the first field-effect transistor.

41. The method of claim 40, wherein buffering the third control signal further comprises passing the third control signal through a pair of inverters.

42. The method of claim 36, wherein the second control signal has a second logic level during the non-sensing phase.

43. The method of claim 36, further comprising:
applying at least one of the first control signal and the second control signal to a third logic circuit, thereby producing a fifth control signal at an output of the third logic circuit;
applying the fifth control signal to a gate of a third field-effect transistor coupled between a third potential node and the gate of the pass transistor;
wherein the third field-effect transistor is deactivated in response to the fifth control signal during the first and second sensing phases; and
wherein the third field-effect transistor is activated in response to the fifth control signal during the non-sensing phase.

44. The method of claim 43, wherein the third logic circuit is the second logic circuit.

45. The method of claim 29, further comprising:
applying a first control signal to a first input of a NAND gate;
applying a second control signal to a second input of the NAND gate;
applying the second control signal to an input of an inverter;
applying an output of the NAND gate to a gate of a first p-channel field-effect transistor coupled between the first potential node and the gate of the pass transistor; and
applying an output of the inverter to a gate of a second p-channel field-effect transistor coupled between the second potential node and the gate of the pass transistor;
wherein the second control signal has a logic high level during the first and second sensing phases, such that the output of the inverter activates the second p-channel field-effect transistor during the first and second sensing phases;
wherein the first control signal has a logic high level during the first sensing phase, such that the output of the NAND gate activates the first p-channel field-effect transistor during the first sensing phase; and wherein the first control signal has logic low level during the second sensing phase, such that the output of the NAND gate deactivates the first p-channel field-effect transistor during the second sensing phase.

46. The method of claim 45, further comprising:
applying the output of the inverter to a gate of a first n-channel field-effect transistor coupled between a third potential node and the gate of the pass transistor;
wherein the output of the inverter deactivates the first n-channel field-effect transistor during the first and second sensing phases.

47. The method of claim 46, wherein the second control signal has a logic low level during a non-sensing phase such that the output of the NAND gate deactivates the first p-channel field-effect transistor during the non-sensing phase, the output of the inverter deactivates the second p-channel field-effect transistor during the non-sensing phase, and the output of the inverter activates the first n-channel field-effect transistor during the non-sensing phase, thereby isolating the gate of the pass transistor from the first and second potential nodes during the non-sensing phase and coupling the gate of the pass transistor to the third potential node during the non-sensing phase.

48. A method of operating a memory device, comprising:
deactivating a pass transistor during a non-sensing phase to isolate a target memory cell from a sensing device;
activating the pass transistor during a first sensing phase to permit coupling of the target memory cell to the sensing device, wherein activating the pass transistor during the first sensing phase comprises coupling a gate of the pass transistor to a first potential node through an unfiltered path and to a second potential node through a filtered path;
activating the pass transistor during a second sensing phase to permit coupling of the target memory cell to the sensing device, wherein activating the pass transistor during the second sensing phase comprises isolating the gate of the pass transistor from the first potential node while the gate of the pass transistor remains coupled to the second potential node through the filtered path; and
sensing a programmed state of the target memory cell during the second sensing phase, while the gate of the pass transistor is coupled to the second potential node through the filtered path and while the gate of the pass transistor is isolated from the first potential node.

49. The method of claim 48, wherein the method is performed in the order presented.

50. The method of claim 48, wherein the filtered path includes an RC filter.

51. The method of claim 48, wherein the first potential node and the second potential node are coupled to receive the same supply potential.

52. A memory device including a column select circuit having a pass transistor and further having a driver circuit coupled to supply a gate bias to a gate of the pass transistor, wherein the driver circuit comprises:
an output coupled to the gate of the pass transistor;
an unfiltered path having a first potential node coupled to receive a first supply potential, and a first field-effect transistor interposed between the first potential node and the output; and
a filtered path having a second potential node coupled to receive a second supply potential, and a second field-effect transistor interposed between the second potential node and the output;

wherein the driver circuit has a first state to couple the gate of the pass transistor to the second potential node through the filtered path and to isolate the gate of the pass transistor from the first potential node;

wherein the driver has a second state to couple the gate of the pass transistor to at least the first potential node through the unfiltered path; and wherein the driver has a third state to isolate the gate of the pass transistor from both the first potential node and the second potential node.

53. An electronic system having a memory device coupled to a processor, wherein the memory device includes a column select circuit having a pass transistor and further having a driver circuit coupled to supply a gate bias to a gate of the pass transistor, wherein the driver circuit comprises:

an output coupled to the gate of the pass transistor;

an unfiltered path having a first potential node coupled to receive a first supply potential, and a first field-effect transistor interposed between the first potential node and the output; and a filtered path having a second potential node coupled to receive a second supply potential, and a second field-effect transistor interposed between the second potential node and the output;

wherein the driver circuit has a first state to couple the gate of the pass transistor to the second potential node through the filtered path and to isolate the gate of the pass transistor from the first potential node;

wherein the driver has a second state to couple the gate of the pass transistor to at least the first potential node through the unfiltered path; and wherein the driver has a third state to isolate the gate of the pass transistor from both the first potential node and the second potential node.

* * * * *